United States Patent [19]
Kiyono

[11] Patent Number: 5,083,172
[45] Date of Patent: Jan. 21, 1992

[54] DYNAMIC RANDOM ACCESS MEMORY DEVICE FABRICATED WITH TWO KINDS OF FIELD EFFECT TRANSISTOR DIFFERENT IN THICKNESS OF GATE OXIDE FILMS

[75] Inventor: Junji Kiyono, Tokyo, Japan

[73] Assignee: NEC Corporation, Tokyo, Japan

[21] Appl. No.: 645,837

[22] Filed: Jan. 25, 1991

[30] Foreign Application Priority Data

Jan. 25, 1990 [JP] Japan .................................. 2-16840

[51] Int. Cl.$^5$ .................. H01L 29/68; H01L 29/06; H01L 27/02; H01L 29/34
[52] U.S. Cl. .................. 357/23.6; 357/23.13; 357/41; 357/54; 357/51
[58] Field of Search .............. 357/23.6, 41, 54, 23.13, 357/51

[56] References Cited

U.S. PATENT DOCUMENTS 4,270,262  6/1981  Hori et al. ........................ 357/23.6
4,543,594  9/1985  Mohsen et al. .................... 357/23.6
4,543,597  9/1985  Shibata ............................. 357/23.6

Primary Examiner—Mark Prenty
Attorney, Agent, or Firm—Burns, Doane, Swecker & Mathis

[57] ABSTRACT

A dynamic random access memory device comprises memory cells each implemented by a series combination of a switching transistor and a storage capacitor, peripheral circuits fabricated with component field effect transistors, and word lines coupled to the gate electrodes of the switching transistors, and the gate oxide film of each switching transistor is thicker than the gate oxide film of each component field effect transistor, wherein the word lines are coupled through an oxide film thinner than the gate oxide film of the switching transistor to an impurity region so that undersirable electric charges accumulated in the word lines during the fabrication process are discharged to the impurity region before any damages take place in the gate oxide films of the switching transistors.

4 Claims, 4 Drawing Sheets

DYNAMIC RANDOM ACCESS MEMORY DEVICE FABRICATED WITH TWO KINDS OF FIELD EFFECT TRANSISTOR DIFFERENT IN THICKNESS OF GATE OXIDE FILMS

FIELD OF THE INVENTION

This invention relates to a dynamic random access memory device having memory cells of the one-transistor and one-capacitor type and, more particularly, to the component field effect transistors different in thickness of the gate oxide film depending upon voltage level applied thereto.

DESCRIPTION OF THE RELATED ART

A typical example of the dynamic random access memory device has a large number of memory cells associated with peripheral circuits such as address decoder circuits, sense amplifier circuits and input-and-output buffer circuits, and each memory cell is implemented by a storage capacitor coupled in series to a switching transistor. The switching transistor is formed by a MOS field effect transistor, and the MOS field effect transistors are further used for fabricating the peripheral circuits. The switching transistor is gated by an associated word line driven by the address decoder circuit, and a data bit is memorized through the switching transistor in the storage capacitor in the form of electric charges. The associated word line is usually boosted to the power voltage level, however, another random access memory device boosts the selected word line to a higher voltage level than the power voltage level. The word line thus boosted up is expected to improve the switching speed of the switching transistor and gives a large margin to the power voltage level incorporated in the dynamic random access memory device. The boosted word lines provide highly conductive channels to the respective switching transistors and allow the storage capacitors each to occupy a relatively small amount of real estate.

In the prior art process sequence of the random access memory device, gate oxide films are concurrently grown on the major surface of the silicon substrate for not only the switching transistors of the memory cells but also the component field effect transistors of the peripheral circuits, and, for this reason, all of the gate oxide films are approximately equal to one another regardless of the voltage level applied to the gate electrodes thereof. Namely, if a dynamic random access memory device is designed to swing the word line to the power voltage level, all of the MOS field effect transistors have relatively thin gate oxide films. However, if a random access memory device is equipped with word lines boosted to a higher voltage level than the power voltage level, the gate oxide films of all the MOS field effect transistors are relatively thick regardless of the component field effect transistors supplied with the power voltage level.

The higher voltage level is desirable for the dynamic random access memory device as described hereinbefore, but the thick gate oxide films slow down the peripheral circuits. As a result, a problem is encountered in that the high speed switching action of the switching transistors are fairly canceled by the peripheral circuits.

Of course, thin gate oxide films are available as long as the word lines are not boosted up, however, the dynamic random access memory device without any boosted voltage level suffers from a small functional margin or a large amount of real estate occupied by each storage capacitor. Moreover, defects tend to take place in the thin gate oxide films and, accordingly, deteriorate the reliability of the dynamic random access memory cells.

Another problem encountered in the prior art dynamic random access memory device with relatively thin gate oxide films is damages of the gate oxide films due to undesirable charge of the word lines during the fabrication process. Namely, after completion of the word lines, the word lines are exposed to a high dose ion implantation for forming impurity regions in the semiconductor substrate in a self-align manner, and various films are sequentially deposited over the word lines by using a plasma-assisted chemical vapor deposition technique, followed by a plasma etching stage as well as a plasma ashing stage. While these plasma using stages, the word lines tend to be charged and are, accordingly, liable to be damaged by the undesirable electric charges.

SUMMARY OF THE INVENTION

It is therefore an important object of the present invention to provide a dynamic random access memory device in which each component field effect transistor has a relatively thick gate oxide film or a relatively thin gate oxide film depending upon a voltage level applied thereto without sacrifice of the reliability.

To accomplish these objects, the present invention proposes to provide discharging means for discharging electric charges accumulated in word lines during a plasma using process.

In accordance with the present invention, there is provided a dynamic random access memory device fabricated on a semiconductor substrate, comprising: a) a plurality of memory cells each implemented by a series combination of a switching transistor and a storage capacitor, the switching transistor being formed by a field effect transistor with a first gate insulating film; b) a plurality of peripheral units provided in association with the memory cells and including a first power source circuit supplied with a power voltage level for distributing the power voltage level, and a second power source circuit supplied with the power voltage level for supplying a higher voltage level than the power voltage level, one of the peripheral units being fabricated with component field effect transistors each having a second gate insulating film thinner than the first gate insulating film, a gate electrode formed on the second gate insulating film being supplied with the power voltage level; c) a plurality of word lines coupled to the memory cells, one of the word lines being coupled to a gate electrode formed on the first gate insulating film, the gate electrode on the first gate insulating film being supplied with the higher voltage level; and d) discharging means formed in the semiconductor substrate and coupled to each of the word lines through an insulating film thinner than the first gate insulating film.

BRIEF DESCRIPTION OF THE DRAWINGS

The features and advantages of a dynamic random access memory device according to the present invention will be more clearly understood from the following description taken in conjunction with the accompanying drawings in which.

DESCRIPTION OF THE PREFERRED EMBODIMENT

Arrangement of Dynamic Random Access Memory Device

Figure 1:
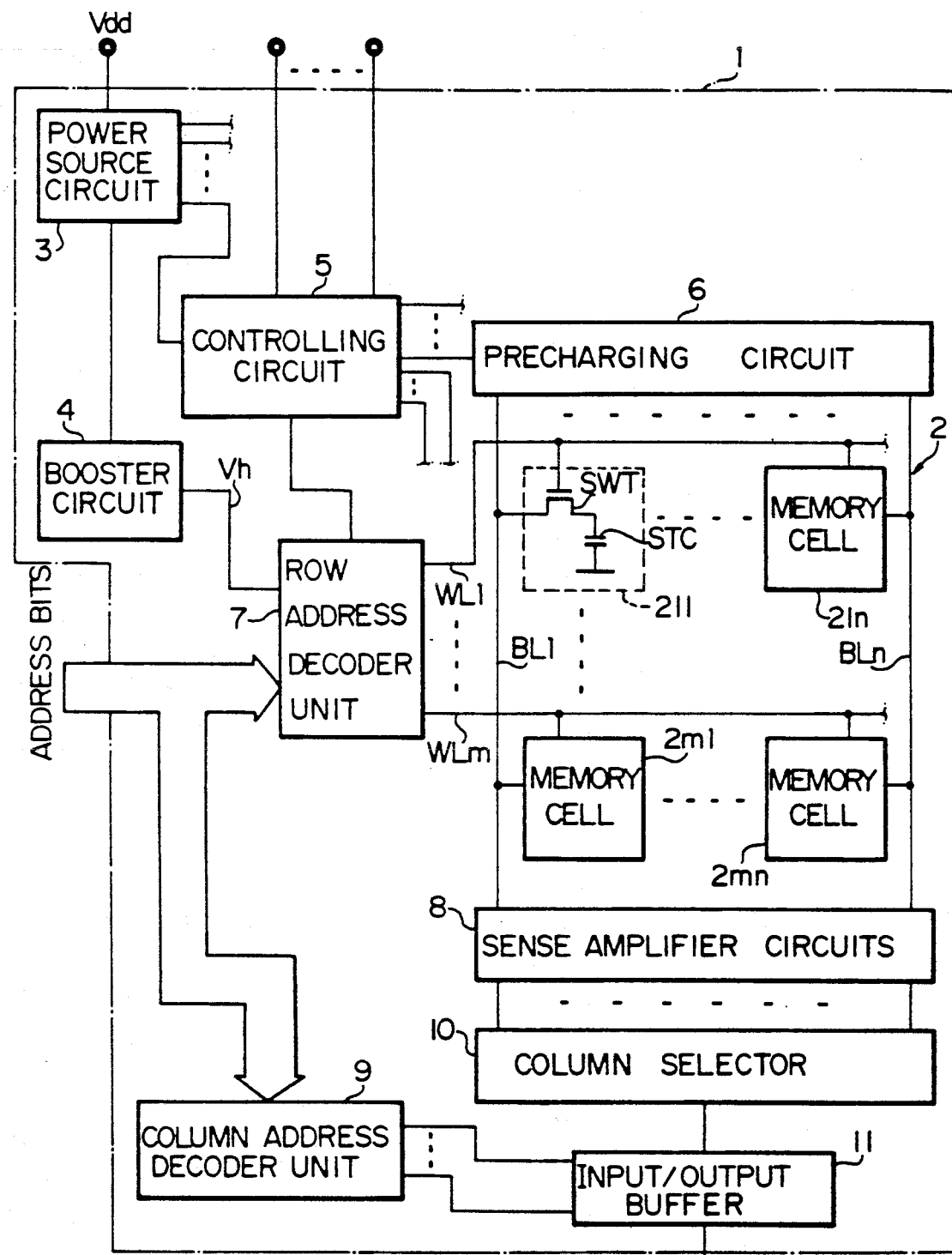
FIG. 1 is a block diagram showing the circuit arrangement of a dynamic random access memory device according to the present invention.

Referring first to FIG. 1 of the drawings, a dynamic random access memory device is fabricated on a semiconductor substrate 1 and comprises a memory cell array 2 and peripheral circuits. The memory cell array 2 has a large number of memory cells 211, 21n, 2m1 and 2mn arranged in rows and columns, and the memory cells 211 to 2mn are of the one-transistor one-capacitor type. Namely, each of the memory cells 211 to 2mn is implemented by a switching transistor SWT coupled in series to a storage capacitor STC, and a data bit is stored in the storage capacitor STC in the form of electric charges. The memory cells 211 to 2mn are coupled to word lines WL1 to WLm, and the word lines WL1 to WLm allow the switching transistors SWT of the memory cells 211 to 2mn to selectively turn on. The memory cells 211 to 2mn are further coupled to bit lines BL1 to BLn, and the bit lines BL1 to BLn propagate the data bits read out from the memory cells 211 to 2mn coupled thereto.

The peripheral circuits include a power source circuit 3 supplied from an external power source with a power voltage level Vdd, a booster circuit 4 for boosting the power voltage level Vdd to a higher voltage level Vh, a controlling circuit 5 responsive to external controlling signals for sequentially producing internal controlling signals, a precharging circuit 6 for precharging the bit lines BL1 to BLn, a row address decoder unit 7 responsive to row address bits for driving one of the word lines WL1 to WLm, sense amplifier circuits 8 for increasing small difference voltage on the bit lines BL1 to BLn representative of the data bits, a column address decoder unit 9 responsive to column address bits for producing a column selecting signal, and a column selector 10 responsive to the column selecting signal for coupling one of the bit lines BL1 to BLn to an input/output buffer circuit 11. In this instance, the power source circuit 3 serves as a first power source circuit, and the booster circuit 4 as a second power source circuit.

The random access memory device thus arranged selectively enters a write-in mode and a read-out mode of operation. In both of the write-in mode and the read-out mode of operation, the row address decoder circuit 7 allows one of the word lines WL1 to WLm to be boosted to the higher voltage level Vh, and the switching transistors SWT coupled to the word line concurrently turn on to provide conduction paths between the associated storage capacitors STC and the bit lines BL1 to BLn. If the dynamic random access memory device enters the read-out mode of operation, the data bits are read out from the storage capacitors STC to the bit lines BL1 to BLn, and the sense amplifier circuits 8 quickly decide the logic levels of the data bits. One of the data bits is transferred through the column selector 10 to the input/output buffer circuit 11, and the data bit is supplied to an external device.

In the write-in mode of operation, a new data bit is supplied from an external data source to the input/output buffer circuit 11, and the input/output buffer circuit 11 transfers the new data bit through the column selector 10 to one of the bit lines BL1 to BLn. One of the word lines WL1 to WLm is boosted to the higher voltage level Vh, and the new data bit is stored in the storage capacitor STC in the form of electric charges.

Structure of Memory Cell

Figure 2:
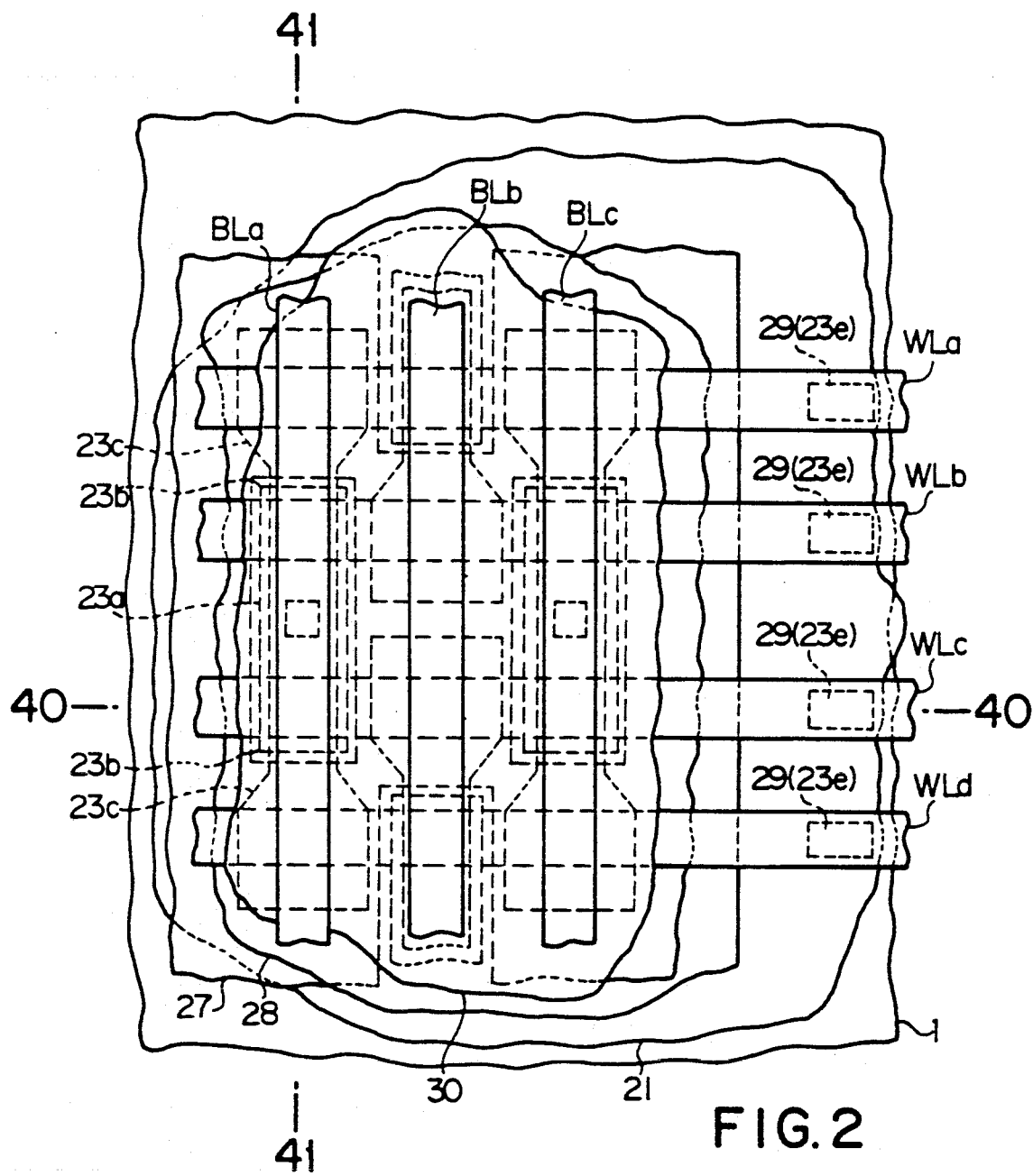
FIG. 2 is a plan view showing the layout of random access memory cells incorporated in the dynamic random access memory device shown in FIG. 1.
Figure 3:
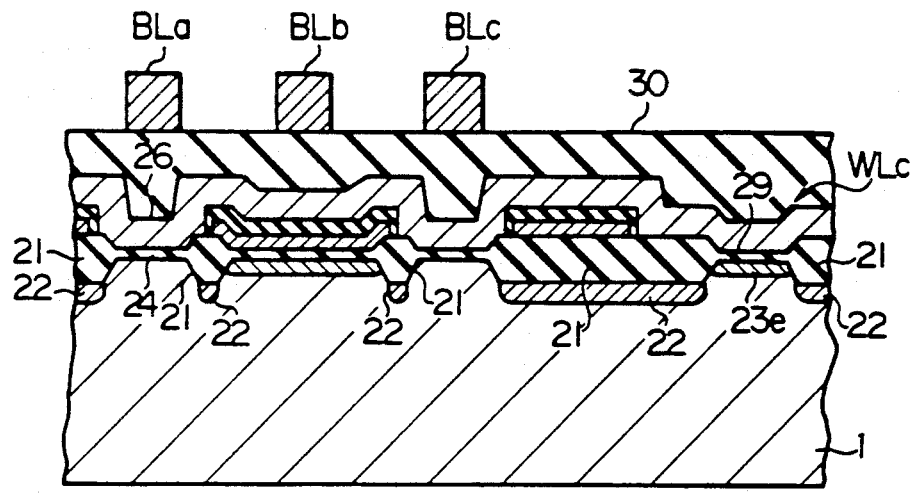
FIG. 3 is a cross sectional view taken along line 40—40 of FIG. 2.
Figure 4:
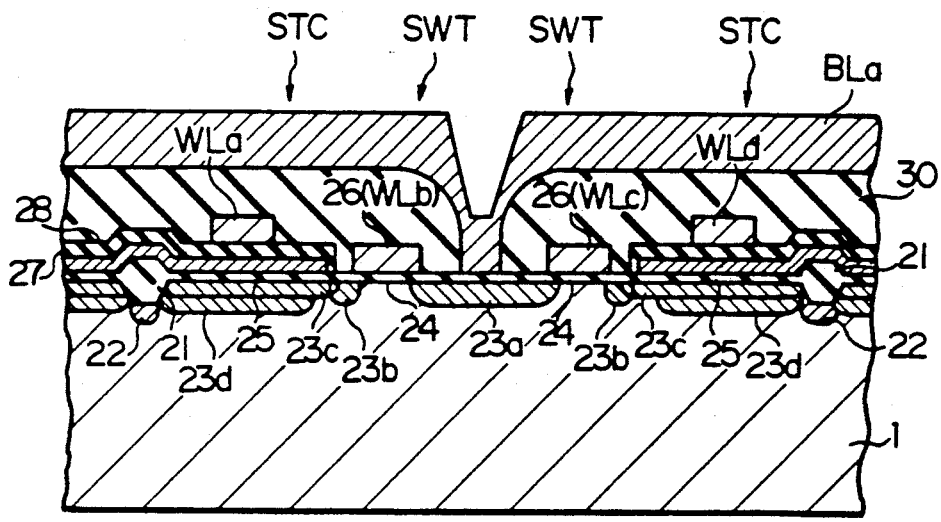
FIG. 4 is a cross sectional view taken along line 41—41 of FIG. 2.

Turning to FIGS. 2 to 4, each of the memory cells 211 to 2mn is fabricated on the semiconductor substrate 1, and the semiconductor substrate 1 is formed of a lightly doped p-type single crystal silicon in this instance. On the semiconductor substrate 1 is selectively grown a thick field oxide film 21 under which heavily doped p-type channel stopper 22 are formed. The thick field oxide film 21 defines active areas of the semiconductor substrate 1, and the memory cells 211 to 2mn occupy the active areas, respectively. In each active area are formed an n-type common source/drain region 23a, n-type source/drain regions 23b and n-type lower capacitor electrode regions 23c partially overlapped with p-type lower electrode regions 23d, and the n-type lower capacitor electrode regions 23c are contiguous to the n-type source/drain regions 23b. First gate oxide films 24 are grown on that area between the n-type common source/drain region 23a and the n-type source/drain regions 23b, and dielectric films 25 cover the n-type lower capacitor electrode regions 23c. On the first gate oxide films 24 are respectively provided gate electrodes 26 which produce conductive channels between the common n-type source/drain region 23a and the n-type source/drain regions 23b, respectively. The gate electrodes 26, the first gate oxide films 24, the n-type common source/drain region 23a and the n-type source/drain regions 23b form two switching transistors SWT incorporated in the two adjacent memory cells, respectively. The n-type lower capacitor electrode regions 23c are faced through the dielectric films 25 with an upper capacitor electrode plate 27, and the p-type lower capacitor electrode regions 23d, the n-type lower capacitor electrode regions 23c, the dielectric films 25 and the upper capacitor electrode plate 27 form in combination two storage capacitors STC respectively coupled to the two switching transistors SWT.

The upper capacitor electrode plate 27 is covered with first inter-level insulating films 28, and the word lines WLa, WLb, WLc and WLd extend on the first inter-level insulating films 28. As will be better seen from FIG. 1, the word line WLc goes down on the first gate oxide film 24 and serves as the gate electrode 26. The other word lines WL1 to WLm including the word lines WLa, WLb and WLd also provide gate electrodes of the switching transistors SWT. In the semiconductor substrate 1 surrounded by the thick field oxide film 21 is formed thin oxide films 29 which cover n-type impurity regions 23e, respectively. The word lines WL1 to WLm are held in contact with the thin oxide films 29, and the thin oxide films 29 are thinner than the first gate oxide films 24. The n-type impurity region 23e serves as discharging means, and electric charges accumulated in the word lines in plasma using processes are discharged to the n-type impurity regions 23e prior to any damage of the first gate oxide films 24, because the thin oxide film 29 is much liable to be broken down rather than the first gate oxide film 24.

The word lines WL1 to WLm and the gate electrodes 26 are covered with a second inter-level insulating film 30, and the bit lines BL1 to BLn extend on the second inter-level insulating film 30. Three of the bit lines BL1 to BLn are shown in FIGS. 2 and 2 and designated by BLa, BLb and BLc. Contact holes are formed in the second inter-level insulating film 30, and one of the contact holes is illustrated in FIG. 4. The contact hole shown in FIG. 4 allows the bit line BLa to be held in contact with the n-type common source/drain region 23a, and, for this reason, the data bit is read out from either storage capacitor STC to the bit line BLa.

Structure of Another Component Field Effect Transistor

Figure 5:
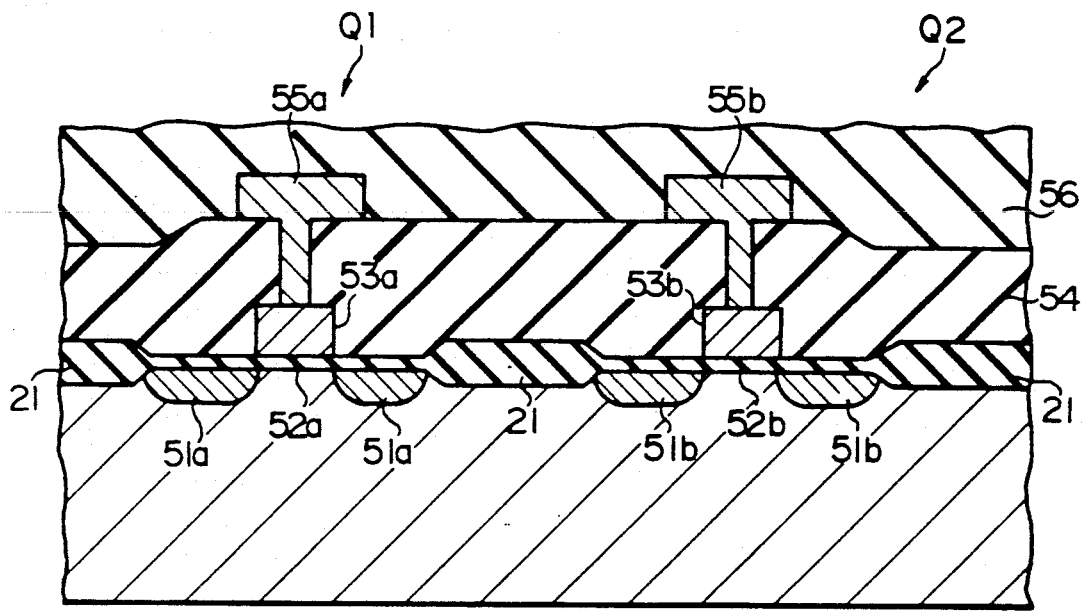
FIG. 5 is a cross sectional view showing a component field effect transistor used for fabricating a peripheral circuit incorporated in the dynamic random access memory device shown in FIG. 1.

Turning to FIG. 5 of the drawings, two component field effect transistors Q1 and Q2 are fabricated on the semiconductor substrate 1, and the field effect transistors Q1 and Q2 are incorporated in one of the peripheral circuits such as, for example, the column selector circuit 10. The thick field oxide film 21 also defines active areas, and n-type source/drain regions 51a and 51b are formed in the active areas, respectively. The active areas are covered with second gate oxide films 52a and 52b, and the second gate oxide films 52a and 52b are thinner than the first gate oxide films 24. For this reason, the peripheral units achieve high speed operations, respectively. On the second gate oxide films 52a and 52b are formed gate electrodes 53a and 53b which are covered with a inter-level insulating film 54. Contact holes are formed in the inter-level insulating film 54 and allow wiring strips 55a and 55b to be held in contact with the gate electrodes 53a and 53b, respectively. The inter-level insulating film 54 is overlain by another inter-level insulating film 56, however, no description is made on the inter-level insulating film 56 as well as signal lines thereon, because they are not directly related to the gist of the present invention.

Fabrication Process

Description is hereinbelow made on a process sequence for fabricating the dynamic random access memory device shown in FIGS. 1 to 5. The process sequence starts with preparation of the semiconductor substrate 1. P-type impurity atoms are doped in the semiconductor substrate 1, and the thick field oxide film 21 is selectively grown over the doped regions of the p-type impurity atoms, thereby forming the channel stopper 22 under the thick field oxide film 21. The active areas are defined by the thick field oxide film 21, The semiconductor substrate 1 is doped with p-type impurity atoms, and the p-type lower capacitor electrode regions 23d are formed in the active areas, and n-type impurity atoms are doped into the semiconductor substrate 1, thereby concurrently forming the n-type lower capacitor electrode regions 23c and the n-type impurity regions 23e. The dielectric films 25 are formed over the n-type lower capacitor electrode regions 23c, and the upper capacitor electrode plate 27 is patterned on the dielectric films 25. The first inter-level insulating film 28 is deposited over the entire surface of the structure, and the active areas of the semiconductor substrate 1 are partially exposed by selectively removing the oxide films for forming the switching transistors SWT and the component field effect transistors including the transistors Q1 and Q2.

The exposed surfaces of the active areas are thermally oxidized, and oxide films are formed on the surfaces, respectively. However, the oxide films thus grown are removed except for the first gate oxide films 24, and the second gate oxide films 52a, 52b and the thin oxide films 29 are thermally grown on the exposed surfaces. Since the first gate oxide films 24 are further grown in the second thermal oxidation, the first gate oxide films 24 become thicker than the second gate oxide films 52a, 52b and the thin oxide films 29. The two-stage thermal oxidation is effective to form the oxide films different in thickness.

Subsequently, the word lines WL1 to WLm are formed on the first inter-level insulating films 28, the first gate oxide films 24 and the thin oxide films 29, and the gate electrodes 53a and 53b are concurrently formed on the second gate oxide films 52a and 52b. The gate electrodes 26 are located on the first gate oxide films 24, and the gate electrodes 53a and 53b are provided on the second gate oxide films 52a and 52b. The n-type impurity atoms are ion-implanted into the active areas using the gate electrodes 26, 53a and 53b as a mask. The n-type source/drain regions 23a, 23b, 51a and 51b are formed in the active areas in a self-aligned manner.

The second inter-level insulating film 30 is then deposited over the entire surface of the structure, and contact holes are formed therein. The bit lines BL 1 to BLn are patterned, and one of the bit lines BL1 to BLn reaches the n-type common source/drain region 23a, thereby being held in contact therewith. The wiring strips 55a and 55b are further held in contact with the gate electrodes 53a and 53b through the contact holes, respectively.

In this instance, the first gate oxide films 24 are of the order of 150 to 750 angstroms, and the second gate oxide films 52a and 52b and the thin oxide films 29 are as thin as about 100 to 250 angstroms.

Although particular embodiments of the present invention have been shown and described, it will be obvious to those skilled in the art that various changes and modifications may be made without departing from the spirit and scope of the present invention. For example, the higher voltage level Vh is produced by the booster circuit 4, however, the higher voltage level Vh may be directly supplied from an external high voltage source. Another dynamic random access memory device according to the present invention may be fabricated on an epitaxial substrate having a lightly doped p-type epitaxial layer grown on a heavily doped p-type substrate. Moreover, the memory cells 211 to 2mn may be formed in p-type wells, and the switching transistors as well as the component field effect transistors may be of the p-channel type formed on an n-type semiconductor substrate or n-type wells.

What is claimed is:

1. A dynamic random access memory device fabricated on a semiconductor substrate, comprising:
 a) a plurality of memory cells each implemented by a series combination of a switching transistor and a storage capacitor, said switching transistor being formed by a field effect transistor with a first gate insulating film;
 b) a plurality of peripheral units provided in association with said memory cells and including a first power source circuit supplied with a power voltage level for distributing the power voltage level, and a second power source circuit supplied with said power voltage level for supplying a higher voltage level than said power voltage level, one of said peripheral units being fabricated from component field effect transistors each having a second gate insulating film thinner than said first gate insulating film, a gate electrode formed on said second gate insulating film being supplied with said power voltage level;

c) a plurality of word lines coupled to said memory cells, one of said word lines being coupled to a gate electrode formed on said first gate insulating film, said gate electrode on said first gate insulating film being supplied with said higher voltage level; and d) discharging means formed in said semiconductor substrate and coupled to each of said word lines through an insulating film thinner than said first gate insulating film.

2. A dynamic random access memory device as set forth in claim 1, in which said semiconductor substrate has a first conductivity type and in which each of said switching transistor and said component field effect transistor has source and drain regions of a second conductivity type opposite to said first conductivity type, wherein said discharging means are implemented by an impurity region of said second conductivity type.

3. A dynamic random access memory device as set forth in claim 1, in which said first gate insulating film ranges from about 150 angstroms to about 750 angstroms in thickness, and in which said second gate insulating film and said insulating film range from about 100 angstroms to about 250 angstroms in thickness.

4. A dynamic random access memory device as set forth in claim 1, in which said second power source circuit is implemented by a booster circuit supplied from said first power source circuit with said power voltage level.

* * * * *